(12) United States Patent
Cina et al.

(10) Patent No.: US 7,791,126 B2
(45) Date of Patent: Sep. 7, 2010

(54) NON-VOLATILE MEMORY DEVICE

(75) Inventors: Giuseppe Cina, Siracusa (IT); Lorenzo Todaro, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 819 days.

(21) Appl. No.: 11/615,349

(22) Filed: Dec. 22, 2006

(65) Prior Publication Data
US 2007/0183201 A1    Aug. 9, 2007

(30) Foreign Application Priority Data
Dec. 30, 2005    (EP) .................................. 05425941

(51) Int. Cl.
*H01L 29/76*    (2006.01)
(52) U.S. Cl. .......... 257/315; 257/E21.68; 257/E21.682; 257/E21.69; 257/202; 438/257
(58) Field of Classification Search ......... 257/314–315, 257/202–208, E21.68, E21.682, E21.69; 438/257–261
See application file for complete search history.

(56) References Cited
U.S. PATENT DOCUMENTS

| | | | | |
|---|---|---|---|---|
| 5,659,500 A | * | 8/1997 | Mehrad ................. | 365/185.05 |
| 6,144,584 A | | 11/2000 | Kunori et al. .......... | 365/185.18 |
| 6,157,575 A | | 12/2000 | Choi ..................... | 365/185.29 |
| 6,160,297 A | * | 12/2000 | Shimizu et al. ............. | 257/390 |
| 6,765,257 B1 | * | 7/2004 | Mehrad et al. ............... | 257/314 |
| 7,323,726 B1 | * | 1/2008 | Chang et al. ................ | 257/202 |

* cited by examiner

*Primary Examiner*—Kiesha R Bryant
*Assistant Examiner*—Tucker Wright
(74) *Attorney, Agent, or Firm*—Lisa K. Jorgenson; E. Russell Tarleton; Seed IP Law Group PLLC

(57) ABSTRACT

A non-volatile memory device integrated on a semiconductor substrate of a first type of conductivity comprising a matrix of non-volatile memory cells organized in rows, called word lines, and columns, called bit lines, the device including a plurality of equidistantly spaced active areas with the non-volatile memory cells integrated therein, each non-volatile memory cell having a source region, a drain region and a floating gate electrode coupled to a control gate electrode, a group of the memory cells sharing a common source line of a second type of conductivity, an implanted region of said second type of conductivity inside at least one of the plurality of active areas in electric contact with the common source line, and at least one source contact aligned and in electric contact with the implanted region.

28 Claims, 2 Drawing Sheets

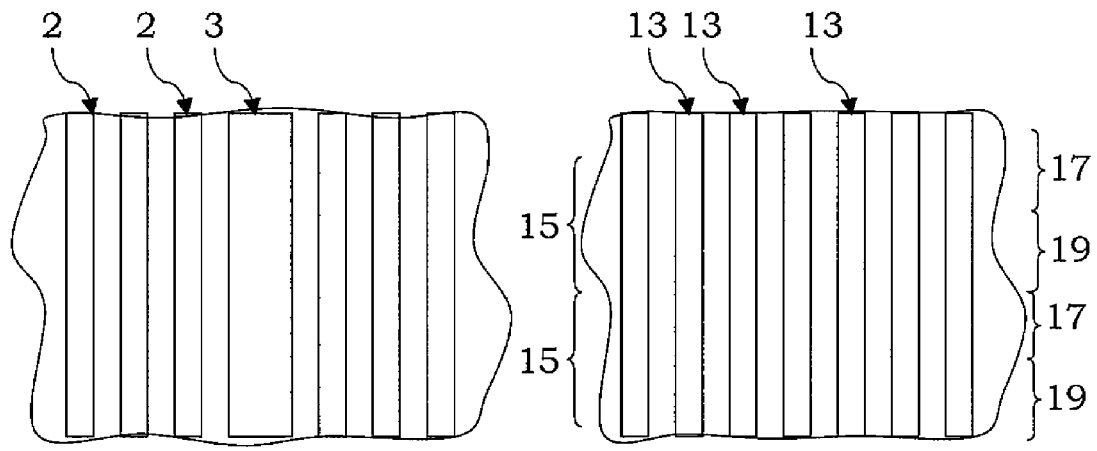
Fig. 2
Fig. 6
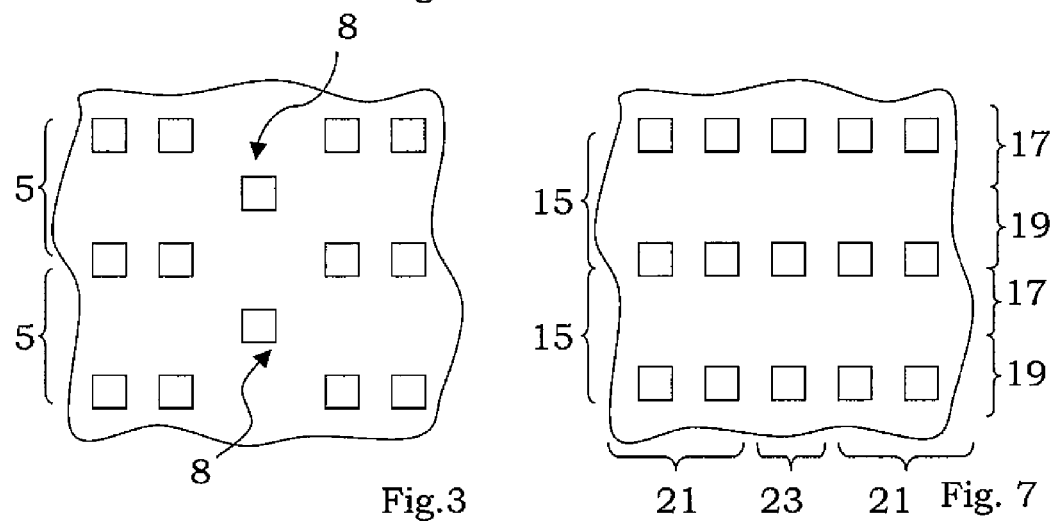
Fig. 3
Fig. 7
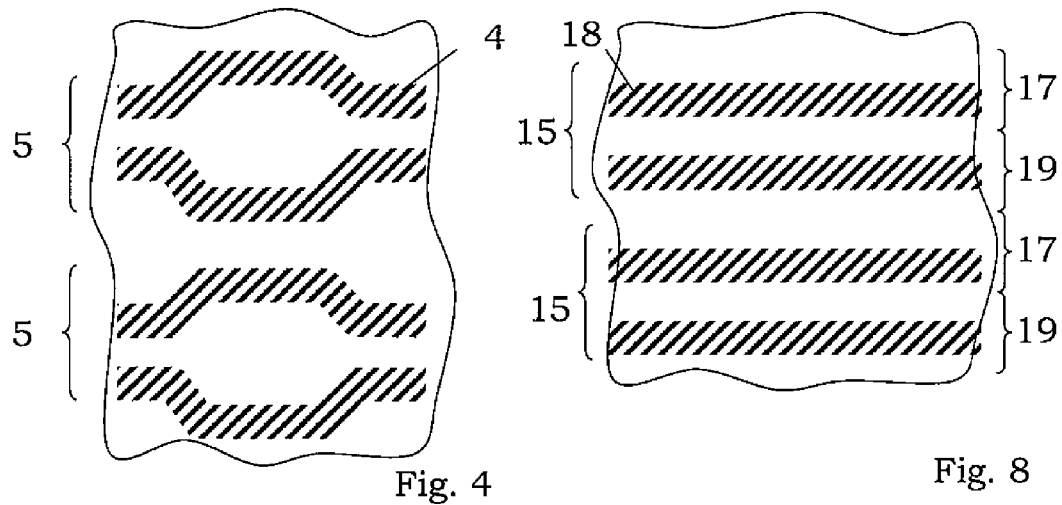
Fig. 4
Fig. 8

NON-VOLATILE MEMORY DEVICE

BACKGROUND OF THE INVENTION

1. Field of the Invention

The present invention relates to a non-volatile memory circuit and to the corresponding manufacturing process and more particularly to a non-volatile memory device of the Flash type.

2. Description of the Related Art

Non-volatile memory electronic devices, for example of the Flash type, integrated on a semiconductor substrate typically have a matrix of non-volatile memory cells organized in rows, called word lines, and columns, called bit lines.

Each single non-volatile memory cell in one form is a MOS transistor wherein the gate electrode, placed above the channel region, is floating, i.e., it has a high DC impedance towards all the other terminals of the same cell and of the circuit wherein the cell is inserted.

The cell also includes a second electrode, called a control gate, which is capacitively coupled to the floating gate electrode through an intermediate dielectric layer, so called interpoly. This second electrode is driven by means of suitable control voltages. The other electrodes of the transistor are the usual drain and source terminals.

The cells belonging to a same word line share the electric line that drives the respective control gates, while the cells belonging to a same bit line share the drain terminals.

An architecture for non-volatile memory matrixes of the NOR type is for example shown in FIGS. 1-4.

In particular on a semiconductor substrate 1 a plurality of active areas 2 are formed wherein the memory cells will be formed. Groups G1 of active areas, wherein the active areas 2 are equidistant from each other, are separated by active areas 3 of greater dimension with respect to the active areas 2 and are spaced further from these groups of active areas.

Each active area 2, 3 is surrounded by an oxide layer called field oxide.

A photolithographic mask used to form these active areas 2, 3 is shown in FIG. 2.

After having formed at least one tunnel oxide layer and a first polysilicon layer on the semiconductor substrate 1, the floating gate electrodes of the memory cells 6 having width W are then defined, in this polysilicon layer, along a first direction.

After having formed at least one interpoly layer and a second polysilicon layer on the whole memory matrix, the second conductive layer, the second dielectric layer, the first conductive layer and the first dielectric layer are etched in sequence by means of a photolithographic mask until the semiconductor substrate 1 is exposed and the gate electrodes of the memory cells 6 having length L are completed.

In particular, with this latter etching step, in the second conductive layer word lines 4 of the matrix of memory cells 6 are defined. The portions of word lines aligned with the floating gate electrodes form control gate electrodes of the single memory cells 6.

A photolithographic mask used to form a plurality of word lines 4 is shown in FIG. 4.

In matrixes of memory cells with NOR architecture, groups 5 of memory cells 6 share a common source line 7. This common source line 7 is obtained by removing a portion of the oxide layer between adjacent active areas and by carrying out a dopant implantation in the semiconductor substrate 1.

To avoid too high of a resistance in the common source line 7, a contact region 8 must be inserted to contact the common source line 7. This contact region 8 is formed in correspondence with the active area 3, which has been provided with greater dimensions with respect to the active areas wherein the single memory cells are formed. In order to allocate the contact region 8 without electric interference problems, the common source line 7 will have to provide a widened pad 9 in correspondence with this contact regions 8.

Also the polysilicon layer forming the word lines 4 must thus provide a particular shaping to allow the insertion of the contact region 8 as shown in FIG. 1.

Ideally, the common source line 7 is generally self-aligned with the word lines and thus the word lines must be formed so as to follow the profile of the widened pad 9.

After having formed drain regions of the memory cells 6 inside the active areas 2, drain contacts 10 aligned with each other are formed, while the contact region 8 is formed in correspondence with the widened pad 9.

A photolithographic mask used to form the drain contacts and the contact region 8 is shown in FIG. 3.

In this type of NOR architecture, the selection of the single memory cell 6 occurs by placing the word lines of the cell 6 to be selected, and thus its control electrode, and one of the lines which are connected to the drain contact 10 of the cell 6 to be selected at a high potential, so that the current flow passes from the drain contact 10 to the contact region 8 through the common source line 7 as shown by the arrows A, B, and C of FIG. 1.

Although advantageous under several viewpoints, this first solution has several drawbacks.

In fact, when the dimensions of the memory cells 6 decrease, it is not possible to proportionally decrease the dimensions of the contact region 8, and thus of the relative widened pad 9, without causing malfunctions of the memory cells.

In consequence, not only the area dedicated to the contact region 8 is to be increased with respect to the dimension of a memory cell 6, but also the regularity with which the active areas 2, 3 of the memory cells are formed in correspondence with the contact region 8 is to be interrupted.

However, this interruption of the periodicity generates a structure that is highly sensitive to the aberrations of the projection optical system.

The technical problem underlying the present invention is that of providing a non-volatile memory electronic device having such structural characteristics as to enable forming the contact region of the common source line without increasing the dimensions of the memory matrix, maintaining the symmetry of the matrix of memory cells.

BRIEF SUMMARY OF THE INVENTION

The solution disclosed herein includes implanting a highly doped region in an active area of the matrix of memory cells and to form the contacts of the source line in correspondence with this highly doped region.

In accordance with one embodiment, a memory device is provided that includes a plurality of active areas formed on the semiconductor substrate and spaced equidistant from each other; said non-volatile memory cells integrated in said plurality of active areas, each non-volatile memory cell comprising a source region, a drain region, and a floating gate electrode coupled to a control gate electrode, a group of said memory cells sharing a common source line of a second type of conductivity integrated in said semiconductor substrate; an implanted region of said second type of conductivity inside at least one of said plurality of active areas in electric contact with said common source line; and at least one source contact aligned and in electric contact with said implanted region.

In accordance with another embodiment, a method of manufacture is provided that includes forming an insulating layer on the semiconductor substrate; selectively removing said insulating layer from the semiconductor substrate by means of a photolithographic technique that provides the use of a first photolithographic mask to form active areas equidistant from each other; forming an implanted region of a second type of conductivity in at least one of said active areas; forming gate electrodes of the memory cells, including one floating gate electrode and one control gate electrode; forming word lines of the memory matrix; removing from said semiconductor substrate portions of the insulating layer and forming a common source implanted region of said second type of conductivity in said semiconductor substrate, said source implanted region shared by groups of said memory cells, said common source implanted region in electric contact with said implanted region of the second type of conductivity; and forming at least one source contact in correspondence with said implanted region.

In accordance with another embodiment of the invention, a circuit is provided that includes a plurality of non-volatile memory cells formed in a plurality of active areas on a substrate of first conductivity type; an implanted region of a second conductivity type inside at least one of the plurality of active areas and in electric contact with a source line; and at least one source contact in electric contact with the implanted region to conduct current from a drain contact formed in another active area of the plurality of active areas to the at least one source contact through the source line and the implanted region.

In accordance with another aspect of the foregoing embodiment, the plurality of active areas have the same dimensions and are spaced equidistant from each other. Ideally, each active area includes a pair of memory cells formed symmetrical about the source line to share a same source region that electrically couples a group of pairs of memory cells. In addition, each contact region comprises a pair of source contacts formed symmetrical about the source line to couple groups of memory cells in the plurality of active areas.

In accordance with another embodiment, a circuit is provided that includes a plurality of non-volatile memory cells formed in a plurality of active areas on a substrate of first conductivity type; a plurality of drain contacts formed in a plurality of drain regions of a group of the plurality of non-volatile memory cells and sharing a same word line; an implanted region of second conductivity type inside at least one of the plurality of active areas and in electric contact with a source line; and at least one source contact in electric contact with the implanted region to conduct current from one of the plurality of drain contacts formed in another active area of the plurality of active areas to the at least one source contact through the source line and the implanted region.

BRIEF DESCRIPTION OF THE SEVERAL VIEWS OF THE DRAWINGS

The characteristics and the advantages of the device according to the invention will be apparent from the following description of an embodiment thereof given by way of indicative and non limiting example with reference to the annexed drawings, wherein:

FIGS. 2-4 show schematic views of a portion of some photolithographic masks used during the successive steps of a process for manufacturing two adjacent portions of the memory electronic device of FIG. 1;

FIGS. 6-8 show schematic views of a portion of some photolithographic masks used during successive steps of a process for manufacturing two adjacent portions of the memory electronic device of FIG. 5.

DETAILED DESCRIPTION OF THE INVENTION

With reference to the foregoing figures, a non-volatile electronic memory device and the corresponding manufacturing process are described.

The process steps and the structures described hereafter do not form a complete process flow for manufacturing integrated circuits.

The figures showing cross sections of portions of an integrated circuit during the manufacturing are not drawn to scale, but they are instead drawn so as to show the important characteristics of the invention.

The embodiments disclosed herein can be put into practice together with the techniques for manufacturing integrated circuits currently used in the field, and only those commonly used process steps necessary for the comprehension of the present invention are included.

Figure 1:
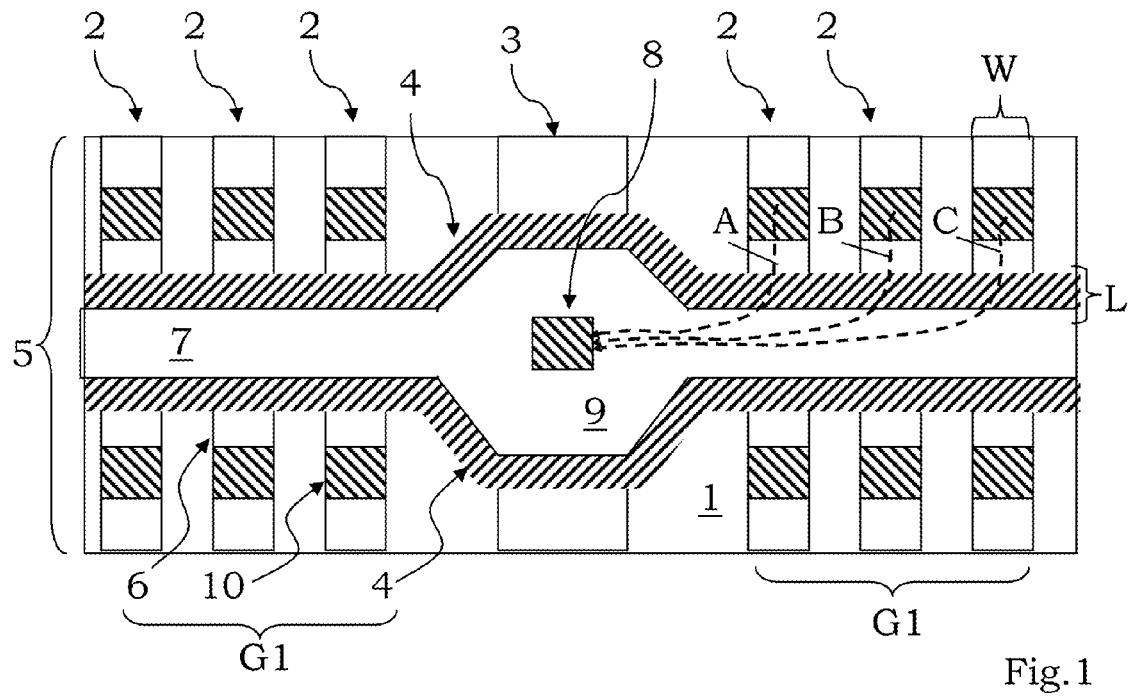
FIG. 1 shows a plan schematic view of a portion of memory electronic device formed according to the prior art.
Figure 5:
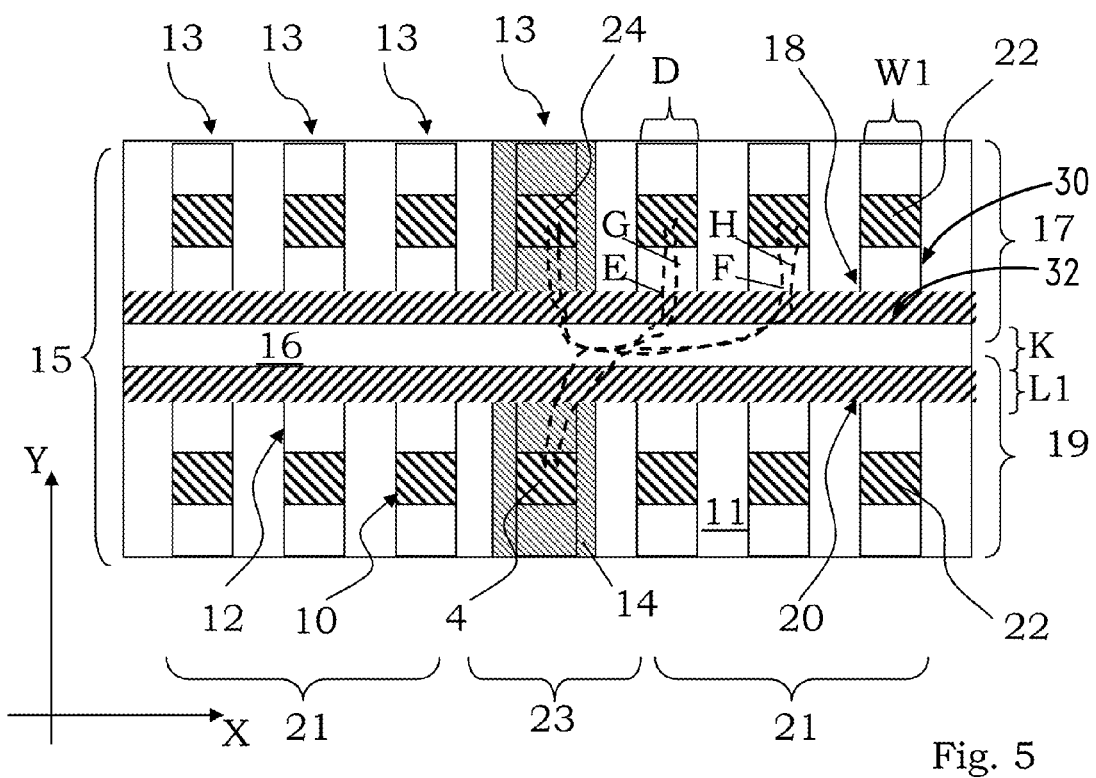
FIG. 5 shows a plan schematic view of a portion of a memory electronic device formed according to the invention.

In particular with reference to FIG. 5, a non-volatile memory device is integrated on a semiconductor substrate 11, which includes a memory matrix formed by a plurality of non-volatile memory cells 12 that are organized in rows, called word lines, and columns, called bit lines. In particular, in the memory matrix a plurality of active areas 13 are formed on the semiconductor substrate 11.

Each active area 13 is at least partially surrounded by a dielectric layer called field oxide. These active areas 13 are equidistant from each other.

Advantageously these active areas 13 are strips formed parallel to each other, extending in a first direction Y and having a same width D.

According to the invention, a dopant-implanted region 14 is formed at least in one active area 13. In particular, this dopant-implanted region 14 is formed along the whole active area 13.

In each active area 13 non-volatile memory cells 12 are formed, each non-volatile memory cell 12 including a source region, a drain region, and a floating gate electrode coupled to a control gate electrode.

Clearly, the memory cells formed in correspondence with the implanted region 14 are not electrically active since the source regions and the drain regions of these cells are short-circuited with each other by the implanted region 14.

In the device according to the invention a group 15 of said plurality of memory cells 12 shares a common source region 16 integrated on the semiconductor substrate 11.

In particular, pairs of cells 12 formed in the same active area 13 and placed symmetrically with respect to the common source region 16 share a same source region, with the source regions of the memory cells 12 belonging to the same group 15 of memory cells electrically connected to each other by the common source region 16.

Advantageously, the common source region 16 is formed by an implanted region extending in a second direction X perpendicular to the first direction Y and having a constant width K.

Ideally, the common source region 16 is also in electric contact with the implanted region 14. Inside the group 15 of memory cells a first and a second group of memory cells can be identified. The first group 17 of memory cells, which is placed above the common source region 16 and formed in different active areas, shares a first word line 18. This word line 18, in particular, connects the control electrodes of the memory cells belonging to the first group 17 of memory cells.

The second group 19 of memory cells, placed below the common source region 16 and formed in different active areas, shares a second word line 20. This word line 20, in particular, connects the control electrodes of the memory cells belonging to the second group 19 of memory cells.

The word lines 18, 20 extend in the same second direction X where the common source region 16 extends. Advantageously, the word lines 18, 20 are rectilinear strips inside the memory matrix. Still advantageously, the device is thus provided with a series of contacts aligned with the active areas 13 and aligned with each other along the first and the second direction Y, X.

In particular, a first group 21 of the series of contacts is aligned with the drain regions of the memory cells and it forms drain contacts 22 of the cells, and a second group 23 of the series of contacts is aligned with the implanted regions and it forms source contacts 24 of the cells.

Also, the selection of the single memory cell 12 occurs by placing the word line 20 of the memory cell 12, and thus its control electrode and one of the lines which are connected to the drain contacts 22 of the single cell 12, at a high potential so that the current flow passes from the drain contact 22 to the source contacts 24, through the common source line 16 and the implanted region 14, as shown by the arrows E, F, G and H of FIG. 5.

In particular, the common source line 16 and the implanted region 14 are formed with two implanted regions with the same type of dopant, for example of the P type, and thus assure an electric continuity for the current flow during the operations of selection of the memory cell 12.

A process is hereafter described for manufacturing a nonvolatile memory electronic device integrated on a semiconductor substrate 11, for example of the N type. The process includes the following steps:

forming an insulating layer on the semiconductor substrate 11.

selectively removing the insulating layer from the semiconductor substrate 1 by means of a photolithographic technique, which provides the use of a first photolitographic mask, for example shown in FIG. 6, to form active areas 13 for the memory cells 12. Preferably, these active areas 13 are equidistant from each other. In accordance with one embodiment, these active areas 13 are strips formed parallel to each other, extending in a first direction Y, equidistant from each other, and having a same width D.

According to one embodiment, a dopant-implanted region 14 is then formed, for example of the P type, in at least one active area 13. In particular, this dopant-implanted region 14 is formed along the whole active area 13.

At least one first dielectric layer, for example of active oxide also known as tunnel oxide, a first conductive layer 4, for example of polysilicon, and a second photolithographic mask are then formed in sequence on the whole semiconductor substrate 11.

The first conductive layer 4 is etched through the second mask, to define floating gate electrodes 30 of the memory cells 12 having width W1 along a first direction Y. For example, this second mask has openings with greater dimensions with respect to the first mask for which the width W1 of the memory cells is greater than the width D of the active area.

Nothing forbids that other process steps can be used to form the floating gate electrodes of the memory cells.

At least one second dielectric layer, for example interpoly oxide, a second conductive layer, for example of polysilicon, and a third photolithographic mask, for example shown in FIG. 8, are then formed, in sequence on the whole semiconductor substrate 11 to define gate electrodes 32 of the memory cells 12 in a second direction X perpendicular to the first direction Y.

The second conductive layer, the second dielectric layer, the first conductive layer, and the first dielectric layer are then etched in sequence through the third mask until the semiconductor substrate 11 is exposed and the gate electrodes of the memory cells 12 having a length L1 are completed.

In particular, with this latter etching step, in the second conductive layer 6 the word lines 18, 20 of the matrix of memory cells 12 are defined. The portions of word lines 18, 20 aligned with the floating gate electrodes 30 form control gate electrodes 32 of the single memory cells 12. Preferably, the word lines 18, 20 are rectilinear strips inside the memory matrix.

From the semiconductor substrate 11 portions of the insulating layer are removed, being comprised between portions of semiconductor substrate 11 wherein the source regions of the memory cells 12 formed in adjacent active areas will be formed.

A common source region 16 is then formed, for example of the P type which is shared by groups 15 of said plurality of memory cells 12.

In particular, pairs of cells 12 formed in the same active area 13 and placed symmetrically with respect to the common source region 16 share a same source region, and the source regions of the memory cells 12 belonging to the same group 15 of memory cells are electrically connected to each other by the common source region 16.

Also the common source region 16 is formed in a second direction X perpendicular to the first direction Y and having a substantially constant width K inside the memory matrix.

After having formed the drain regions in the memory cells 12, and the premetal dielectric layer, openings are formed in correspondence with the drain regions of the memory cells 12 to form drain contacts 22.

Further openings are formed also in correspondence with the implanted region 14 to form source regions 24 of the memory matrix. Advantageously, these further openings are aligned with the first openings along the second direction X.

The openings to form the drain contacts 22 and the source contacts are formed in a single process step through the use of a fourth photolithographic mask, for example the one shown in FIG. 7.

In this embodiment a plurality of drain contacts 22 and at least one source contact are aligned and equispaced in at least a first direction, and advantageously these contacts are aligned and equispaced both in the X direction and in the Y direction.

Further advantageously these source and drain contacts have the same sides.

In these embodiments, where the drain and source contacts are spaced at equal intervals and advantageously have the same sides, the morphology of the matrix cell is completely regular, considerably reducing the inconvenience related to the aberrations of the projection optical system when a non regular photolithographic mask, as that shown in FIG. 3 in which the source contact is not aligned and equispaced from the drain contact, has to be patterned.

In conclusion, the device according to the embodiments described herein enables the formation of the strips of the active areas 13, the strips which define a first width of the floating gate electrodes and the position of the source and drain contacts 22, 24 of the matrix cells 12 with a regular pitch.

The regularity of these structures reduces the dimensions of the minimum photolithographic resolution used to form these memory matrixes with NOR architecture in which a common source line 16 inside the memory matrix is provided. Advantageously, the process steps to form the memory cells of the device according to the invention, after having formed the implanted region 14, are the same as those used to form the memory devices of the prior designs and methods. Moreover, photolithographic masks are used whose photographic definition is simpler than the one of the photolithographic masks used in the known manufacturing processes.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A non-volatile memory device integrated on a semiconductor substrate of a first type of conductivity having a matrix of non-volatile memory cells organized in rows, called word lines, and columns, called bit lines, the device comprising:
   a plurality of active areas formed on the semiconductor substrate and spaced equidistant from each other;
   said non-volatile memory cells integrated in said plurality of active areas, each non-volatile memory cell comprising a source region, a drain region, and a floating gate electrode coupled to a control gate electrode, a group of said memory cells sharing a common source line of a second type of conductivity integrated in said semiconductor substrate;
   an implanted region of said second type of conductivity inside at least one of the plurality of active areas in electric contact with said common source line, the implanted region short circuiting a drain region with a source region in one of the at least one of the plurality of active areas; and
   at least one source contact aligned and in electric contact with said implanted region.

2. The memory device of claim 1 wherein each of said plurality of active areas has the shape of a strip formed parallel to other strips and extending in a first direction.

3. The memory device of claim 1 wherein each of said plurality of active areas has a width D.

4. The memory device of claim 1 wherein said common source region has a constant width.

5. The memory device of claim 2 wherein said common source line is formed by an implanted region extending in a second direction that is perpendicular to said first direction.

6. The memory device of claim 2 wherein at least one source contact is aligned and equispaced along a second direction with a series of drain contacts formed in correspondence with said drain regions of a group of memory cells sharing a same word line.

7. The memory device of claim 1 wherein the word lines comprise rectilinear conductive strips inside the memory matrix.

8. The memory device of claim 1 wherein the word lines are formed in a second direction.

9. The memory device of claim 1 wherein pairs of cells formed in a same active area and placed symmetrically with respect to said common source line share a same source region, said source regions of said memory cells belonging to said group of memory cells electrically connected to each other by the common source line.

10. The memory device of claim 6 wherein said source and drain contacts have the same size. , 11. A non-volatile memory device integrated on a semiconductor substrate of a first type of conductivity having a matrix of non-volatile memory cells organized in rows, called word lines, and columns, called bit lines, the device comprising:
   a plurality of active areas formed on the semiconductor substrate and spaced equidistant from each other;
   said non-volatile memory cells integrated in said plurality of active areas, each non-volatile memory cell comprising a source region, a drain region, and a floating gate electrode coupled to a control gate electrode, a group of said memory cells sharing a common source line of a second type of conductivity integrated in said semiconductor substrate;
   an implanted region of said second type of conductivity inside at least one of said plurality of active areas in electric contact with said common source line, the implanted region short circuiting a drain region with a source region in one of the at least one of the plurality of active areas;
   at least one source contact aligned and in electric contact with said implanted region; and
   a plurality of drain contacts formed in correspondence with said drain regions of a group of memory cells sharing a same word line, said plurality of drain contacts aligned and equispaced with said at least one source contact.

12. The memory device of claim 11 wherein said source and drain contacts have the same size.

13. The memory device of claim 11 wherein said source and drain contacts are aligned and equispaced in two orthogonal directions.

14. The memory device of claim 11 wherein said plurality of active areas has the shape of strips being parallel to each other and extending in a first direction.

15. The memory device of claim 11 wherein said plurality of active areas have a same width D.

16. The memory device of claim 1 wherein said common source line has a constant width.

17. The memory device of claim 14 wherein said common source line is formed by an implanted region extending in a second direction perpendicular to said first direction.

18. The memory device of claim 11 wherein said word lines are rectilinear conductive strips inside the memory matrix.

19. The memory device of claim 18 wherein said word lines are formed in said second direction.

20. The memory device of claim 11 wherein pairs of cells are formed in a same active area and placed symmetrically with respect to said common source region to share a same source region, said source regions of said memory cells belonging to said group of memory cells are electrically connected to each other by the common source region.

21. A circuit, comprising:
   a plurality of non-volatile memory cells formed in a plurality of active areas on a substrate of first conductivity type;
   an implanted region of a second conductivity type inside at least one of the plurality of active areas and in electric contact with a source line, the implanted region short circuiting a drain region with a source region in the at least one of the plurality of active areas; and at least one source contact in electric contact with the implanted region to conduct current from a drain contact formed in another active area of the plurality of active areas to the at least one source contact through the source line and the implanted region.

22. The circuit of claim 21 wherein the plurality of active areas have the same dimensions and are spaced equidistant from each other.

23. The circuit of claim 22 wherein each active area comprises a pair of memory cells formed symmetrical about the source line to share a same source region that electrically couples groups of pairs of memory cells.

24. The circuit of claim 22 wherein each source contact comprises a pair of source contacts formed symmetrical about the source line to couple groups of memory cells in the plurality of active areas.

25. A circuit, comprising:
a plurality of non-volatile memory cells formed in a plurality of active areas on a substrate of first conductivity type;
a plurality of drain contacts formed in a plurality of drain regions of a group of the plurality of non-volatile memory cells and sharing a same word line;
an implanted region of second conductivity type inside at least one of the plurality of active areas and in electric contact with a source line, the implanted region short circuiting a drain region with a source region in one of the active areas; and
at least one source contact in electric contact with the implanted region to conduct current from one of the plurality of drain contacts formed in another active area of the plurality of active areas to the at least one source contact through the source line and the implanted region.

26. The circuit of claim 25 wherein the plurality of active areas have the same dimensions and are spaced equidistant from each other.

27. The circuit of claim 26 wherein each active area comprises a pair of memory cells formed symmetrical about the source line to share a same source region that electrically couples groups of pairs of memory cells.

28. The circuit of claim 26 wherein each source contact comprises a pair of source contacts formed symmetrical about the source line to couple groups of memory cells in the plurality of active areas.

* * * * *